United States Patent
Taniguchi et al.

(10) Patent No.: US 6,744,251 B2
(45) Date of Patent: Jun. 1, 2004

(54) INSPECTION APPARATUS USING NUCLEAR-MAGNETIC-RESONANCE

(75) Inventors: Yo Taniguchi, Kokubunji (JP); Yukari Yamamoto, Kunitachi (JP); Hisaaki Ochi, Kodaira (JP); Shinichiro Umemura, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 5 days.

(21) Appl. No.: 10/309,150

(22) Filed: Dec. 4, 2002

(65) Prior Publication Data

US 2003/0160615 A1 Aug. 28, 2003

(30) Foreign Application Priority Data

Feb. 26, 2002 (JP) ..................... P2002-048939

(51) Int. Cl.[7] .................................................. G01V 3/00
(52) U.S. Cl. .................................................. 324/318
(58) Field of Search ................. 324/300, 307, 324/309, 318, 322; 600/407, 410, 422

(56) References Cited

U.S. PATENT DOCUMENTS 5,335,173 A * 8/1994 Sasahara .................... 600/407
5,671,157 A * 9/1997 Saito .......................... 345/419
5,730,129 A * 3/1998 Darrow et al. .............. 600/407
5,984,881 A * 11/1999 Ishibashi et al. ............. 601/2
6,421,551 B1 * 7/2002 Kuth et al. .................. 600/410
6,490,473 B1 * 12/2002 Katznelson et al. ......... 600/410
6,653,834 B2 * 11/2003 Beck et al. .................. 324/309
6,668,184 B1 * 12/2003 Kleiman ...................... 600/422

FOREIGN PATENT DOCUMENTS

JP          09-238915          3/1996

* cited by examiner

Primary Examiner—Edward Lefkowitz
Assistant Examiner—Dixomara Vargas
(74) Attorney, Agent, or Firm—Reed Smith LLP; Stanley P. Fisher, Esq.; Juan Carlos A. Marquez, Esq.

(57) ABSTRACT

A nuclear-magnetic-resonance inspection apparatus that enables an examiner to designate directly a section of a subject to be imaged. The NMR inspection apparatus has a section-designating unit containing reference objects A, B, and C that can be set at three reference points, and can be held in the hand of an examiner to be moved and operated in close proximity to the subject, wherein a prescribed part of a plane including the reference objects set at up to three reference points is the section of the subject to be imaged. While watching the subject, the examiner can directly designate a section to be imaged. Thus, diagnoses can be made easily and quickly.

20 Claims, 16 Drawing Sheets

(PLANE VIEW)

(SIDE VIEW)

(PLANE VIEW)

F I G. 8
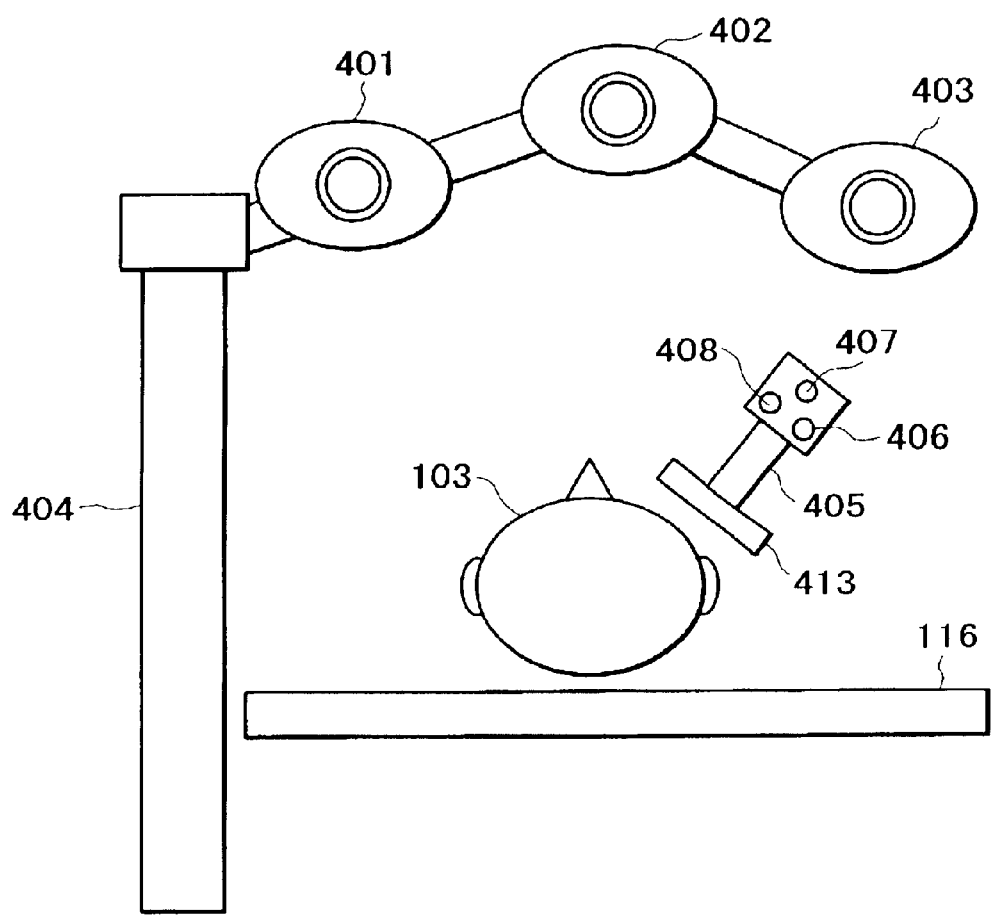

(VIEW FROM ABOVE)

F I G. 1 2
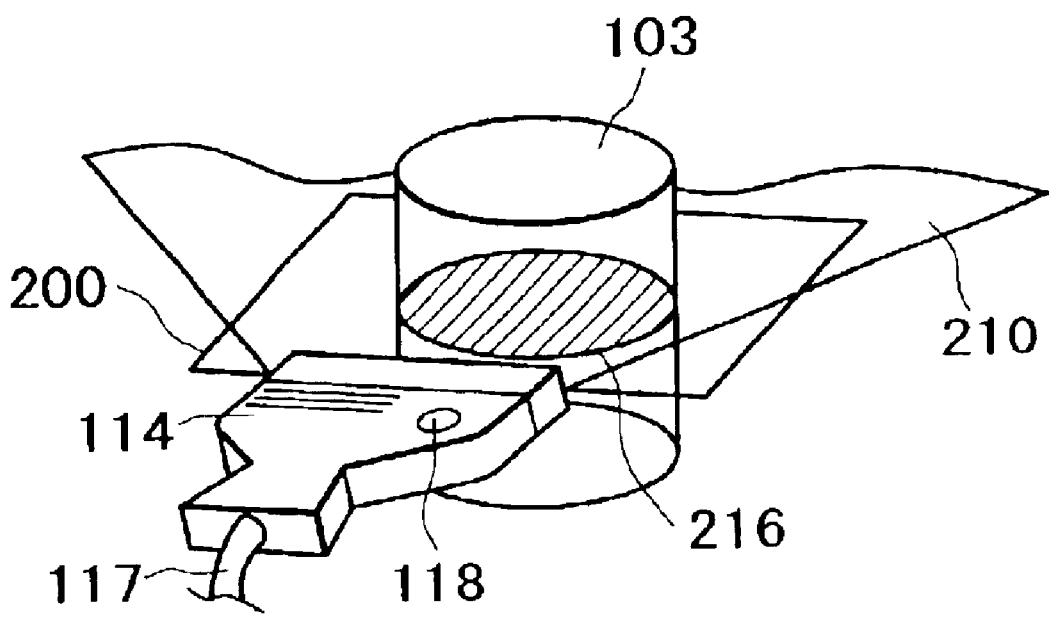

F I G. 1 3
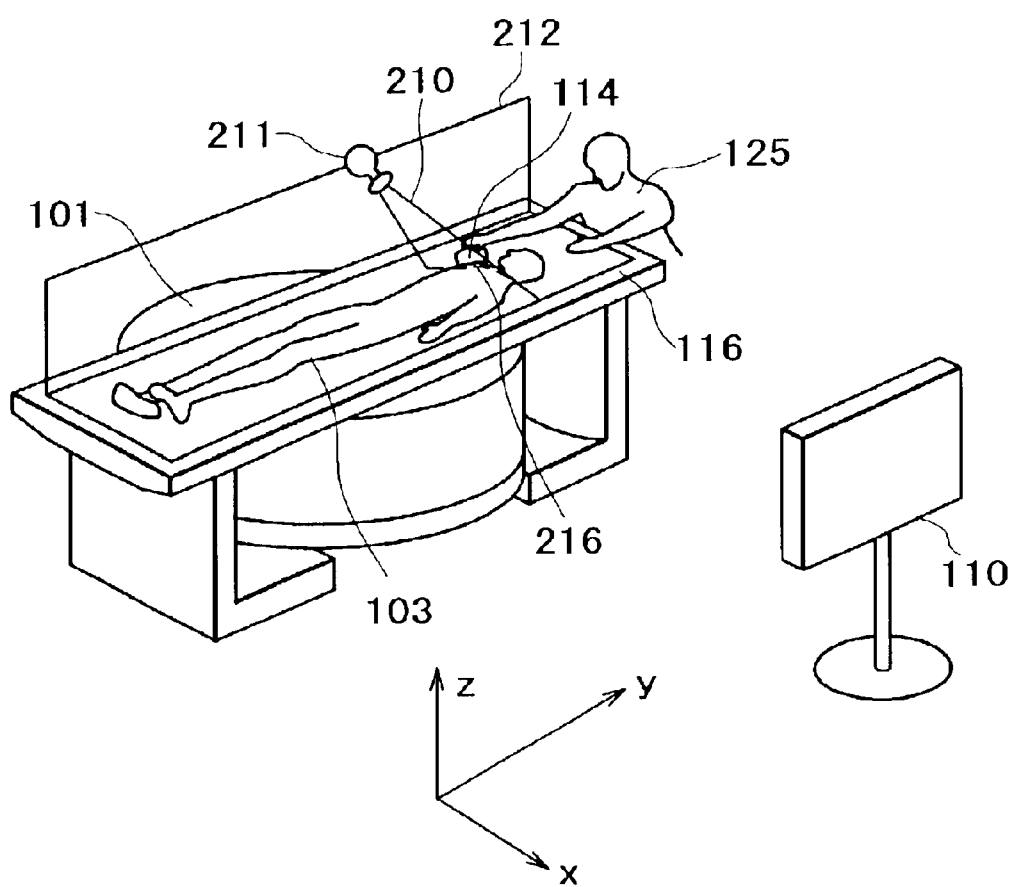

F I G. 1 4
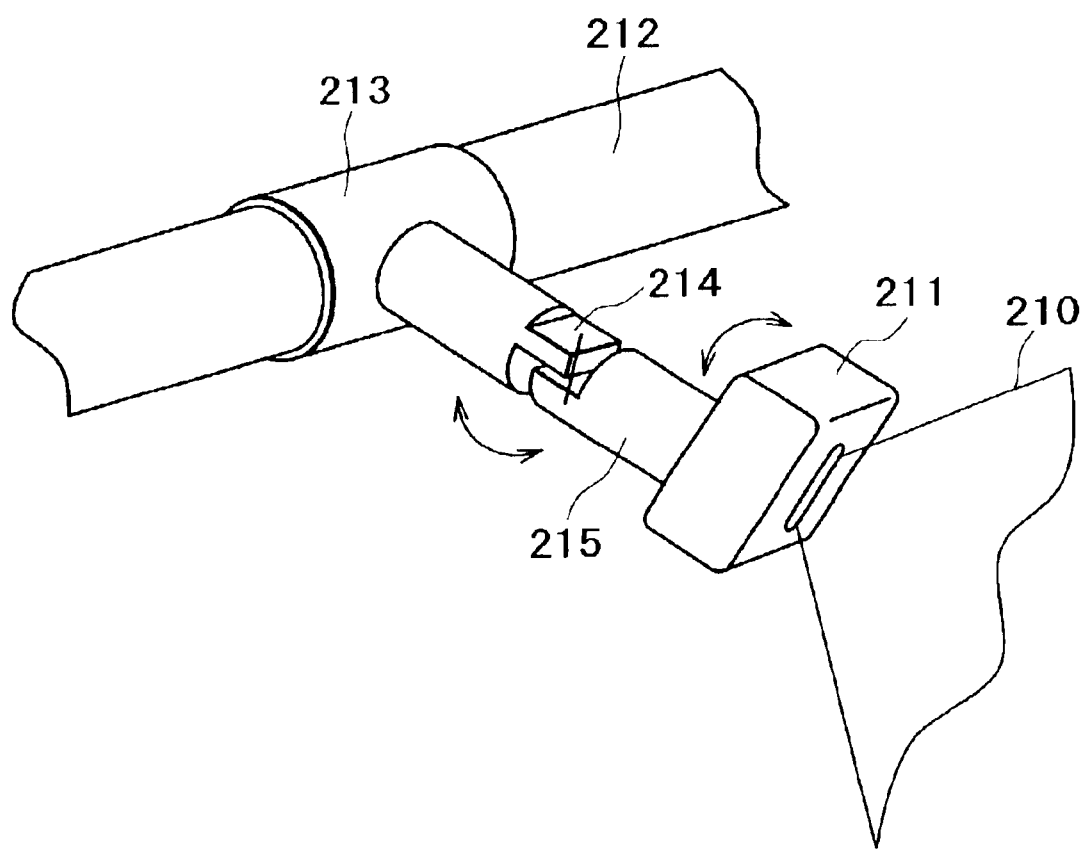

FIG. 15
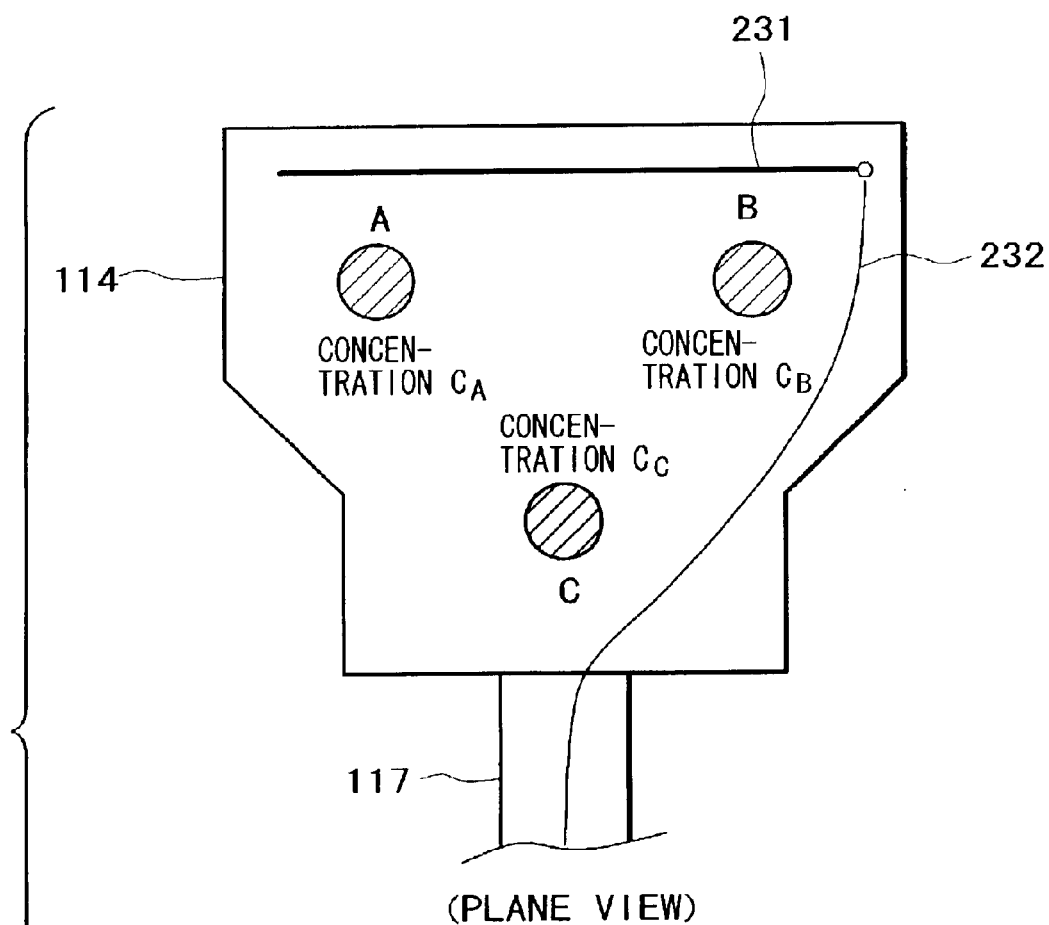
(PLANE VIEW)
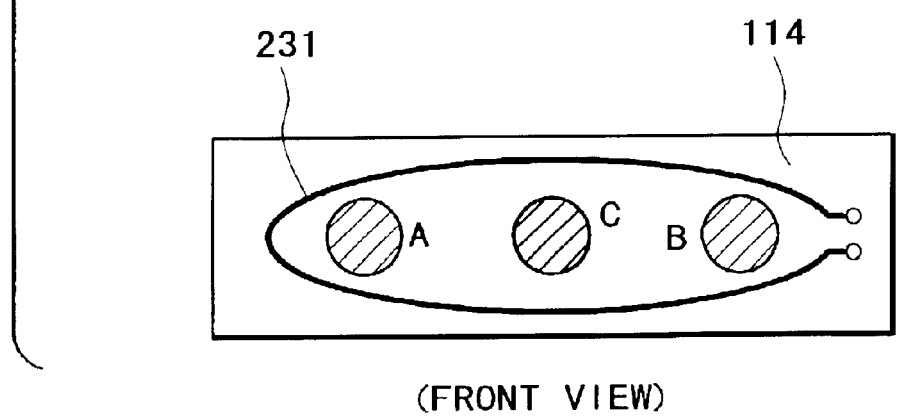
(FRONT VIEW)

INSPECTION APPARATUS USING NUCLEAR-MAGNETIC-RESONANCE

BACKGROUND OF THE INVENTION

1. Field of the Invention

The present invention relates to an inspection apparatus using nuclear-magnetic-resonance (NMR), or an NMR inspection apparatus, which enables an examiner to designate directly a section of a subject to be imaged while watching the subject.

2. Description of Related Art

The nuclear magnetic resonance-imaging apparatus, or MRI apparatus, is a medical image-processing apparatus that causes the nuclear magnetic resonance of water molecules in a section of a subject and reconstructs a sectional image from NMR signals. In general, a slicing magnetic field gradient is applied to a region of a subject to be examined to designate a section to be imaged in the subject. At the same time, an excitation pulse is applied to the subject to excite its spins. An MRI signal (echo) is generated and measured in the phase of focusing of the excited spins. To add positional information to the excited spins, a phase-encoding magnetic field gradient and a read-out magnetic field gradient normal to each other are applied to the subject for the time period from the excitement of the subject to the acquisition of the echo. Measured echoes are arranged in the k-space by an axis of abscissa "kx" and an axis of ordinate "ky". Each echo is represented by a line parallel to the kx-axis. The data in the k-space undergo inverse Fourier transformation to reconstruct an image of the designated section.

The pulse to generate an echo and the magnetic field gradients are applied to the subject in accordance with prescribed pulse sequences. Various pulse sequences for various purposes are known. For example, in the gradient-echo method, or GE method, the pulse to generate an echo is repeatedly applied to a subject. Every time the pulse is applied to the subject, the phase-encoding magnetic field gradient applied to the subject is changed. In this way, the necessary number of echoes for reconstructing a sectional image are measured.

FIG. 1A shows pulse sequences for the GE method. A pulse 201 for a slicing magnetic field gradient in the z-direction and an RF pulse 202 of proton's resonance frequency "$f_0$" for a high-frequency magnetic field to excite the spins of a subject to be examined are applied to the subject in order to induce the NMR of protons in the subject. Then, a pulse 203 for a phase-encoding magnetic field gradient is applied to the subject to add positional information in the phase-encoding direction (y-direction) to the phase of the excited spins and another pulse 206 for a read-out magnetic field gradient for dephasing in the x-direction is applied to the subject. Next, while a pulse 207 for a read-out magnetic field gradient is being applied to add the positional information in the read-out direction (x-direction) to the excited spins, an NMR signal (an echo) 208 is measured. The necessary number of echoes for reconstructing a sectional image are measured while the procedure from the application of the pulse 201 to the measurement of the echo 208 is being repeated in a "TR" cycle. The echoes are arranged in the k-space (209) as shown in FIG. 1B and undergo two-dimensional inverse Fourier transformation to reconstruct a sectional image.

In MRI, while watching an image displayed on a display, the examiner designates a section to be imaged as follows. First, an image of the whole region of interest is taken as a reference image and displayed on the display. Second, a line segment is displayed on the display and the position and angle of the line segment is moved and changed by using a mouse or a cursor to designate a section and take its image. As the need arises, the examiner designates and images a section repeatedly while making changes on the reference image. There is a method of designating a section of a subject by using a plate-like joystick instead of a mouse (JP-A No. 238915/1997: prior art-1). This method enables the examiner to designate a section intuitively because he can designate the inclination of a section as the inclination of the joystick.

In accordance with the prior art-1, the examiner, watching an image on a display at a distance from the subject, designates indirectly a section to be imaged; accordingly, it is difficult for him to grasp the position of a section being designated. In accordance with the prior art-1, the examiner can directly designate the inclination of a section to be imaged with a joystick, but he cannot directly designate the position of the section because the joystick is typically fixed to something.

SUMMARY OF THE INVENTION

The present invention provides a NMR inspection apparatus that enables the examiner to designate directly a section of a subject to be imaged.

One aspect of the present invention is directed to an NMR inspection apparatus that comprises (i) means for generating a static magnetic field, (ii) means for generating magnetic field gradients in first, second, and third directions normal to one another, (iii) means for generating a high-frequency magnetic field, (iv) means for detecting NMR signals derived from a subject, (v) means for processing detected NMR signals, (vi) a section-designating unit for designating a plane including a section of the subject to be imaged, and (vii) a control unit for controlling the means for generating magnetic field gradients, the means for generating a high-frequency magnetic field, the means for detecting NMR signals, the means for processing detected NMR signals, and pulse sequences for taking an image of the section of the subject to be imaged. The means for generating magnetic field gradients is controlled so that a prescribed part of a plane designated by the section-designating unit is the section of the subject to be imaged.

The section-designating unit has reference objects to be set at two or three reference points and is held in the hand of an examiner to be moved and operated in the immediate neighborhood of the subject lying in static magnetic field and magnetic field gradients generated by the means for generating a static magnetic field and the means for generating magnetic field gradients. The examiner, watching the subject, can move and operate the section-designating unit as if he were handling the probe of ultrasound diagnosis equipment. In a preferred embodiment of section-designating unit, the examiner can designate a section of the subject to be imaged by putting the unit into contact with the subject. In another preferred embodiment of section-designating unit, the examiner can designate a section of the subject to be imaged without putting the unit into contact with the subject.

By using the NMR signals derived from the two or three reference objects by the pulse sequences for imaging, the means for processing detected NMR signals finds a plane which includes the middle point between the two reference objects and whose normal vector is a vector connecting the two reference objects or a plane including the three reference objects in terms of reference spatial coordinates. The control unit controls the means for generating magnetic field gradients so that a prescribed part of the plane is the section of the subject to be imaged.

Preferred methods of NMR examination in accordance with the present invention are summarized below.

(1) A method of NMR examination comprising the steps of: (i) designating a plane including a section of the subject to be imaged with the section-designating unit, which has reference objects to be set at two or three reference points and is held in the hand of an examiner to be moved and operated in the immediate neighborhood of the subject lying in the static magnetic field and magnetic field gradients, (ii) finding a plane which includes the middle point between the two reference objects and whose normal vector is a vector connecting the two reference objects or a plane including the three reference objects in terms of reference spatial coordinates, and (iii) controlling the magnetic field gradients so that a prescribed part of the plane is the section of the subject to be imaged.

(2) The method of NMR examination of paragraph (1) further comprising the steps of: (i) taking the images of the reference objects projected in the first, second, and third directions by applying a magnetic field gradient in a first direction to the subject after the application of a high-frequency magnetic field to the subject, applying a magnetic field gradient in a second direction to the subject after the application of another high-frequency magnetic field to the subject, and apply a magnetic field gradient in a third direction to the subject after the application of yet another high-frequency magnetic field to the subject, the two or three reference objects being in the shape of a ball and containing a substance other than water and fat, and (ii) locating the centers of the two or three reference objects by using the projected images in the first, second, and third directions.

(3) The method of NMR examination of paragraph (1) wherein the section-designating unit has selector switches to choose appropriate ones from various parameter values stored in the control unit and the control unit controls the pulse sequences for imaging in accordance with the parameter values chosen by the selector switches to take an image of the section of the subject to be imaged.

(4) The method of NMR examination of paragraph (1) wherein the two or three reference objects are light-emitting diodes (hereinafter referred to as "LEDs") flashing on and off in different cycles and there is provided a step of locating the centers of light-emitting faces of the LEDs by using the images of the LEDs taken by TV cameras.

(5) The method of NMR examination of paragraph (1) wherein there are provided a first display means disposed in a room shielded from electromagnetic waves and a second display means disposed outside the room and an image of the section of the subject to be imaged is displayed simultaneously on both the first and second display means.

(6) The method of NMR examination of paragraph (1) wherein (i) there are provided a first display means disposed in a room shielded from electromagnetic waves and a second display means disposed outside the room, (ii) the section-designating unit has an imaging switch for starting to take an image of the section of the subject to be imaged, and (iii) an image of the section of the subject to be imaged is displayed simultaneously on both the first and second display means while the imaging switch is off and an image of a higher resolution is displayed on both the first and second display means when the imaging switch is turned on.

(7) The method of NMR examination of paragraph (1) wherein the section-designating unit is put into contact with the subject to designate a plane including the section of the subject to be imaged.

(8) The method of NMR examination of paragraph (1) wherein the section-designating unit designates a plane including the section of the subject to be imaged without coming into contact with the subject.

The NMR inspection apparatus and the method of examination of the present invention enable the examiner to designate directly a section of a subject to be imaged easily and quickly while watching the subject.

Other and further objects, features and advantages of the invention will appear more fully from the following description.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 8 illustrates a third preferred example of the section-designating unit for the first preferred embodiment of an NMR inspection apparatus of the present invention;

FIG. 12 is a perspective view of a fifth preferred example of the section-designating unit for the first and second preferred embodiments of an NMR inspection apparatus of the present invention;

FIG. 13 is a perspective view illustrating the second preferred embodiment of an NMR inspection apparatus of the present invention wherein the position of a section to be imaged is indicated on the surface of the subject;

FIG. 14 is a perspective view of a preferred mechanism to change the direction of laser-beam radiation of FIG. 13;

FIG. 15 is a plane view and a front view of a sixth preferred example of the section-designating unit for the first and second preferred embodiments of an NMR inspection apparatus of the present invention.

DETAILED DESCRIPTION OF THE INVENTION

Figure 1A:
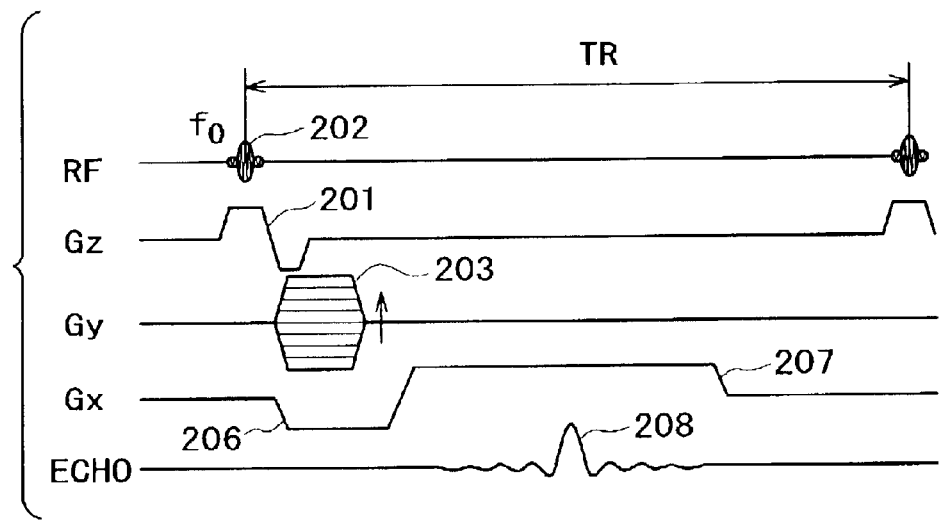
FIG. 1A illustrates pulse sequences used in the GE method of the prior art and FIG. 1B illustrates the echoes measured by the GE method.
Figure 1B:
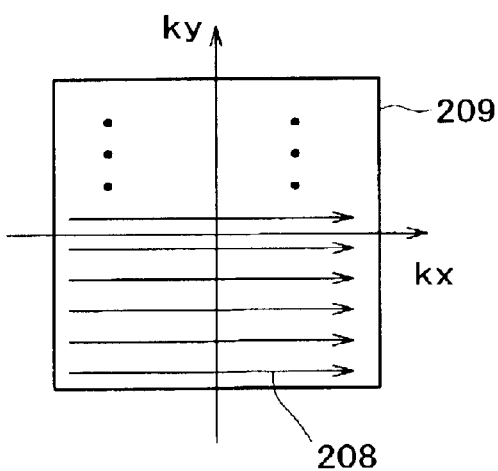

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided herein below with reference to the attached drawings.

The nuclear-magnetic-resonance (NMR) inspection apparatus of the present invention comprises a section-designating unit to designate a plane including a section of the subject to be imaged and a control unit to control (i) means for generating magnetic field gradients in three directions, (ii) means for generating a high-frequency magnetic field, (iii) means for detecting the NMR signals derived from the subject under examination, (vi) means for processing the NMR signals, and (v) pulse sequences for imaging the section. The means for generating magnetic field gradients is controlled so that a prescribed part of the plane designated by the section-designating unit is the section to be imaged.

The section-designating unit has reference objects to be set at two or three reference points and an imaging switch for controlling the start of imaging. Besides, the section-designating unit may be provided with selector switches for choosing appropriate ones among various parameter values stored in the control unit and the control unit may control the pulse sequences with the chosen parameter values to take an image of the designated section.

The section-designating unit is provided with a control switch for controlling "on" and "off" of radiation of planar sectorial light to the subject so as to irradiate planar sectorial light to the subject and thereby indicate the position of a section to be imaged on the surface of the subject. Alternatively, the NMR inspection apparatus may be provided with a light source for generating planar sectorial light and a direction controller for controlling the direction of radiation of the planar sectorial light, and the control unit may control the direction controller so as to irradiate the planar sectorial light to the subject and thereby indicate the position of a section to be imaged on the surface of the subject.

The section-designating unit has reference objects to be set at two or three reference points, a probe for receiving an echo signal, and an imaging switch for controlling the start of imaging.

While the imaging switch of the section-designating unit is off, an image of the section to be imaged is displayed on a display means, and when the imaging switch is turned on, an image of higher spatial resolution is displayed on the display means.

The reference objects to be set at two or three reference points are in the shape of a ball. The reference objects contain a substance other than water and fat. By (i) applying a magnetic field gradient in the first direction to the subject after the application of a high-frequency magnetic field to the subject, (ii) applying a magnetic field gradient in the second direction to the subject after the application of another high-frequency magnetic field to the subject, and (iii) applying a magnetic field gradient in the third direction to the subject after the application of yet another high-frequency magnetic field to the subject, the images of the objects projected in the first, second, and third directions are obtained. From these projected images, the positions of centers of reference objects set at two or three reference points are found.

The NMR inspection apparatus of the present invention has a first display means disposed in a room shielded from electromagnetic waves and a second display means disposed outside the room to display an image of a section to be imaged on the first and second display means simultaneously.

Figure 2:
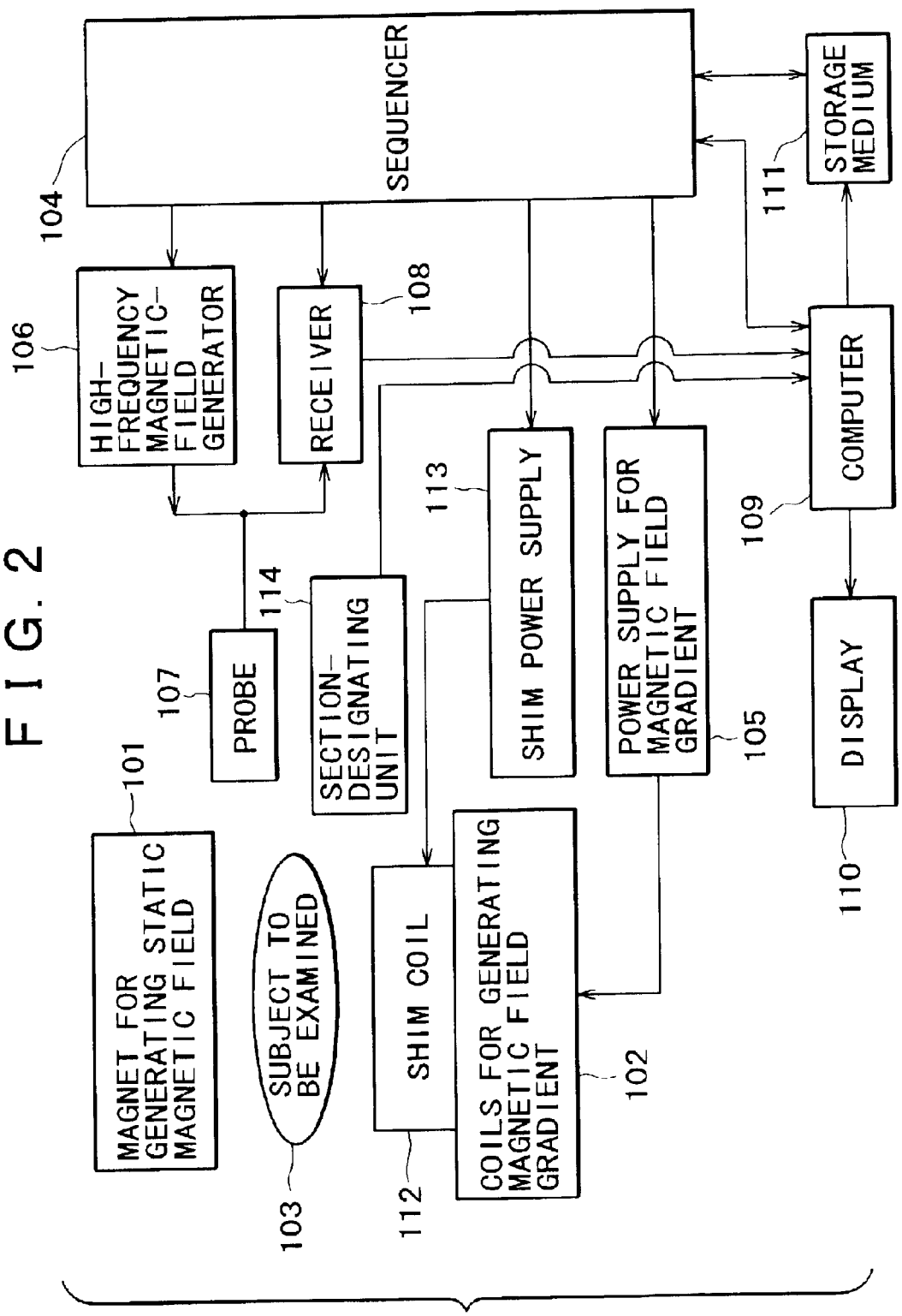
FIG. 2 is a schematic block diagram showing the configuration of a first preferred embodiment of an NMR inspection apparatus of the present invention.

FIG. 2 is a schematic block diagram showing the configuration of a first preferred embodiment of an NMR inspection apparatus of the present invention. In FIG. 2, 101 is a magnet for generating a static magnetic field; 102, coils for generating magnetic field gradients; 103, a subject to be examined. The subject is in the static magnetic field generated by the magnet 101. A sequencer 104 sends a command to a power supply for magnetic field gradient 105, which feeds power to the coils 102, which generate magnetic field gradients. In addition, the sequencer 104 sends a command to a high-frequency magnetic-field generator 106, which generates a high-frequency magnetic field. The high-frequency magnetic field is applied through a probe 107 to the subject 103. Signals derived from the subject 103 are received by the probe 107 and detected by a receiver 108. The reference NMR frequency for the detection is set by the sequencer 104. The detected signals are sent to a computer 109, where signal processing such as image reconstruction is performed. The result of the signal processing is displayed on a display 110. As the need arises, the detected signals and the conditions for measurement are stored in a storage medium 111.

Provided in the static magnetic field is a section-designating unit 114 connected to computer 109 so that the inspector can directly designate a section of the subject 103 to be imaged. If the static magnetic field homogeneity has to be adjusted, shim coils 112 are used. The shim coils 112 comprise a plurality of channels and a shim power supply 113 feeds power to the shim coils 112. The sequencer 104 controls the currents of the shim coils 112 to adjust the static magnetic field homogeneity. The sequencer 104 sends a command to the power supply 113 to cause the shim coils 112 to generate complementary magnetic fields to adjust the static magnetic field homogeneity.

The sequencer 104 normally controls the relevant units so that they will operate at programmed amplitude at programmed moments. Programs prescribing the times and the amplitude of the high-frequency magnetic field, the magnetic field gradients, and the receiving of signals are called "pulse sequences."

Figure 3:
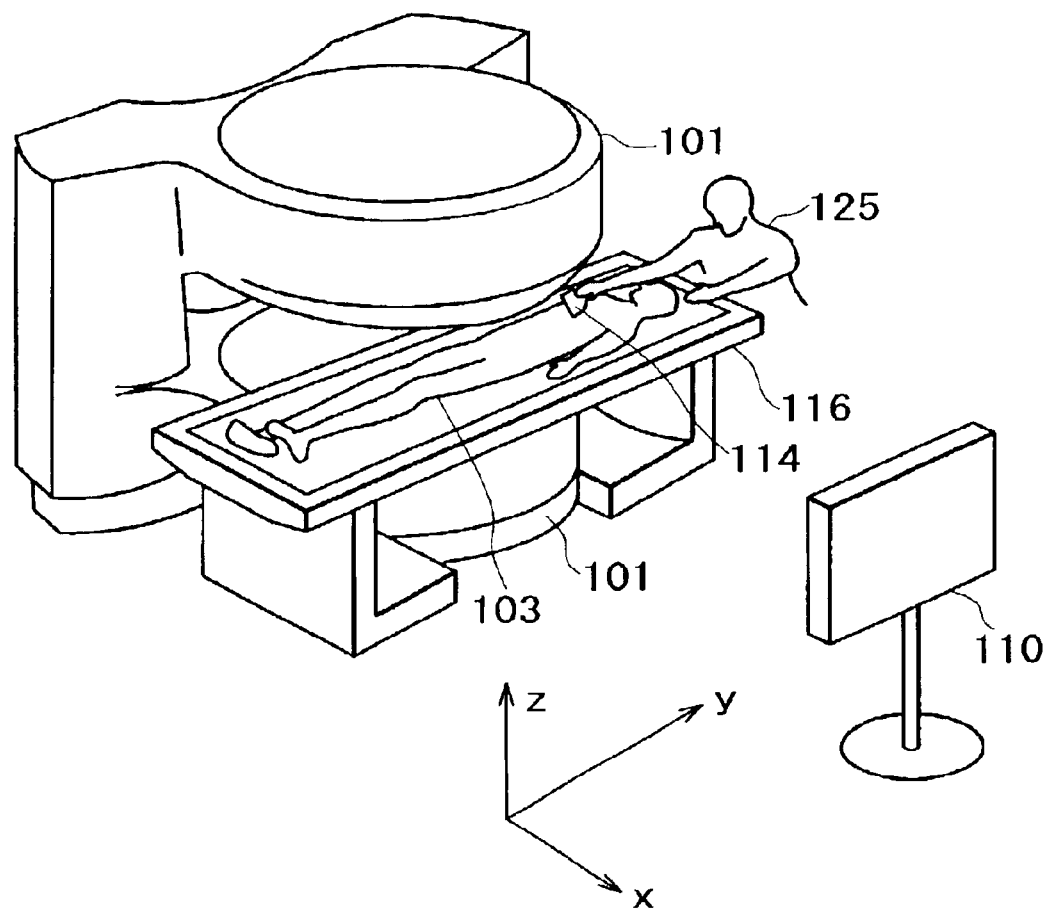
FIG. 3 is a perspective view of the NMR inspection apparatus of FIG. 2 and a subject under examination.

FIG. 3 is a perspective view of the first preferred embodiment of an NMR inspection apparatus of the present invention and a subject under examination. The subject 103 lies on a bed 116 which is positioned in the static magnetic field generated by magnets 101. An examiner 125 has the section-designating unit 114 in his hand to indicate directly a section to be imaged. The image taken is displayed on the display 110 in the neighborhood of the bed 116 so that the examiner 125 can easily observe the image.

Figure 4A:
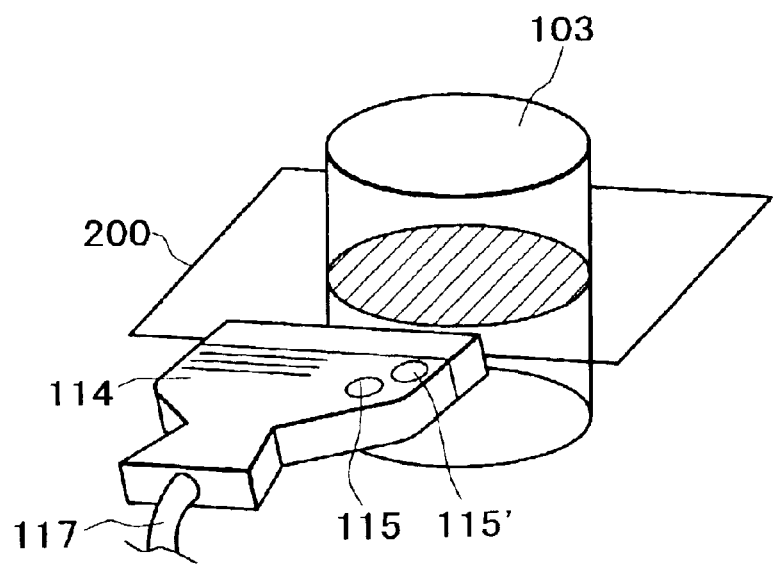
FIGS. 4A and 4B are a perspective view and a plane view, respectively, of a first preferred example of the section-designating unit for the first preferred embodiment of an NMR inspection apparatus of the present invention.
Figure 4B:
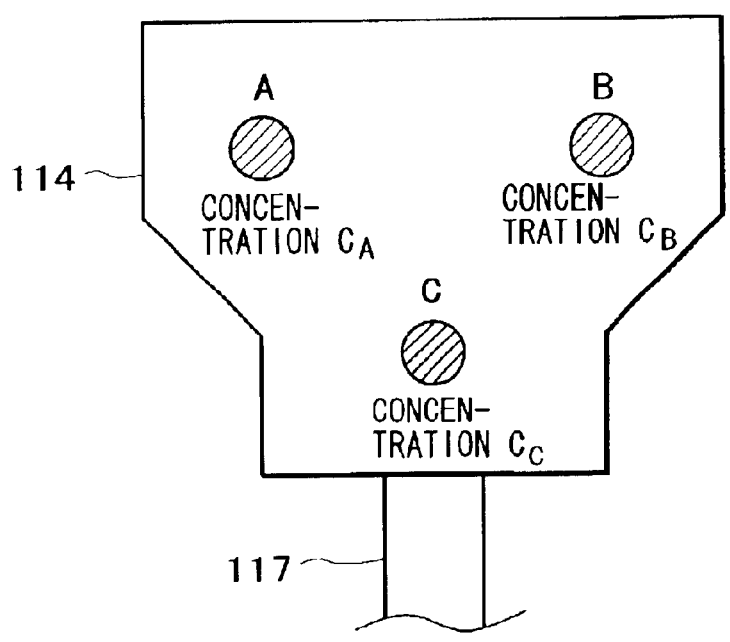

FIGS. 4A and 4B are a perspective view and a plane view, respectively, of a first preferred example of the section-designating unit 114 for the first preferred embodiment of an NMR inspection apparatus of the present invention. In FIG. 4A, the subject 103 is schematically shown as a column. Shown in FIG. 4A is the relation between the section-designating unit 114 and a plane 200 being designated for imaging. As the direction of the section-designating unit 114 is changed, the direction of the plane 200 changes accordingly. The section-designating unit 114 is provided with an imaging switch 115. By pushing the imaging switch 115, a signal is sent from the section-designating unit 114 to the computer 109 through a cable 117 connected to the computer 109 and further to the sequencer 104 so as to identify and image the designated section of the subject 103.

As shown in FIG. 4B, arranged in the section-designating unit 114 are three ball-like objects A, B, and C for identifying the section to be imaged. The objects A, B, and C are filled with a substance (for example, any one of creatine, choline, or the primary standard substance of tetramethylsilane) of a resonance frequency "$f_1$" different from those of water and fat. The ratio of concentration of the $f_1$-resonance substance in the objects A, B, and C is as follows: $C_A:C_B:C_C=1:2:4$.

Figure 5:
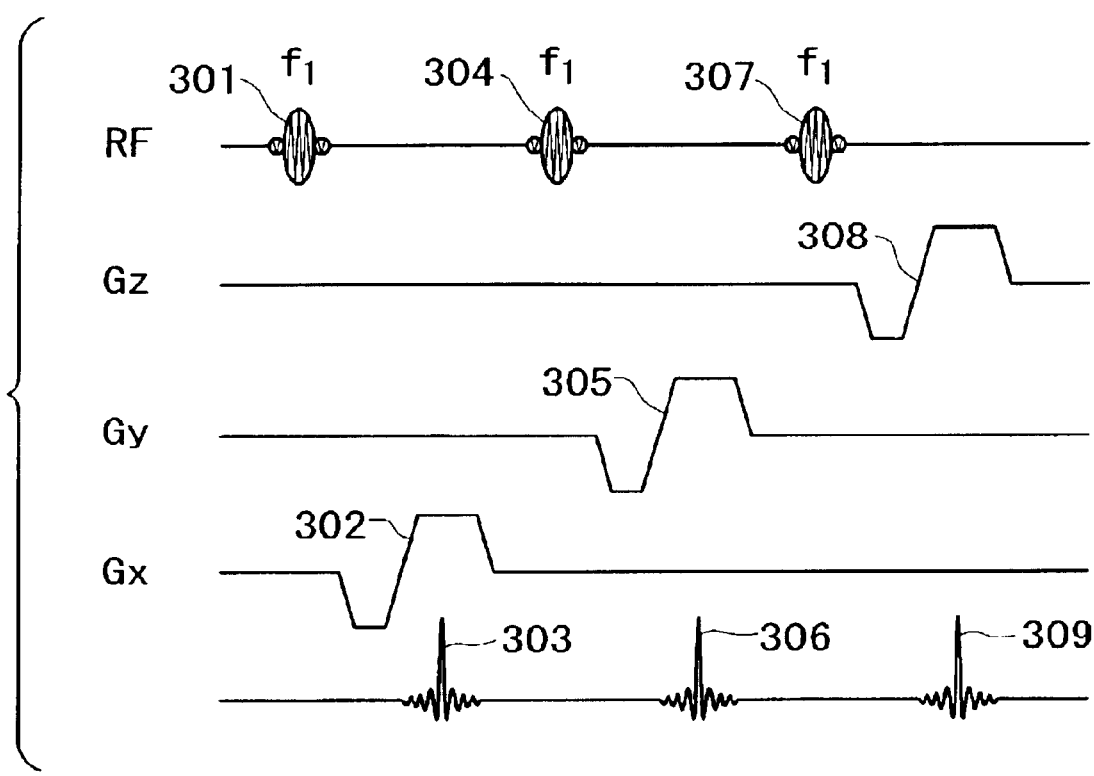
FIG. 5 illustrates pulse sequences to identify a section of a subject with the first preferred example of the section-designating unit of the present invention.

FIG. 5 illustrates pulse sequences to identify the section of the subject to be imaged with the first example 114 of the section-designating unit of the present invention.

Figure 6A:
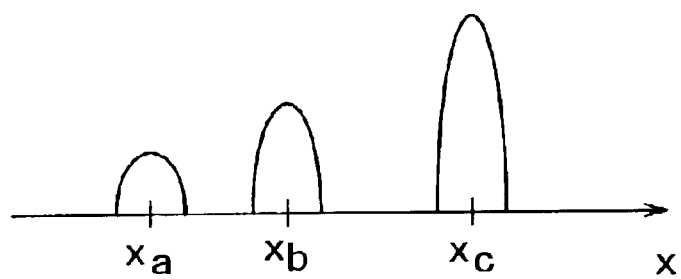
FIGS. 6A, 6B, and 6C illustrate the projected images obtained by applying the pulse sequences of FIG. 5 to ball-like objects.
Figure 6B:
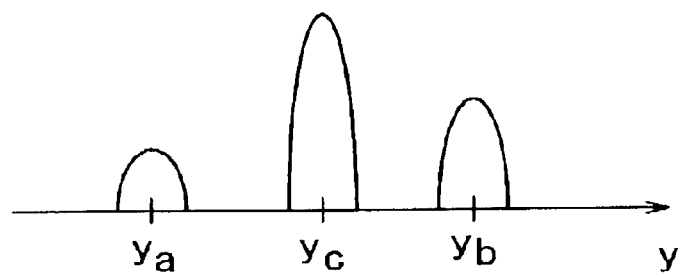
Figure 6C:
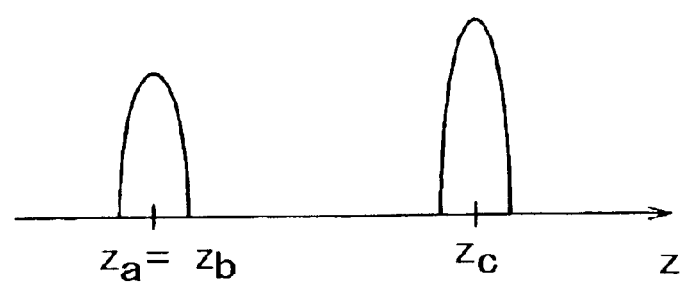

FIGS. 6A, 6B, and 6C illustrate the projected images of the objects A, B, and C obtained by applying the pulse sequences of FIG. 5 to the objects.

The section to be imaged is identified by applying the pulse sequences of FIG. 5 to the ball-like objects of FIG. 4B and measuring the NMR signals from the objects. As shown in FIG. 5, first, an RF pulse 301 is irradiated at frequency "$f_1$" to excite the ball-like objects and an echo 303 is measured with a read-out magnetic field gradient 302 in the x-direction. At that time, substances of resonance frequency "$f_1$" in the subject are also excited; however, because the quantity of the substances in the subject is very small, the echo 303 is not affected by the excitement of the substances. The echo 303 undergoes Fourier transformation and obtained thereby are the images of the ball-like objects A, B, and C projected on the x-axis, as shown in FIG. 6A. The intensity of their images is in proportion to the concentration of the $f_1$-resonance substance in them.

Then, an RF pulse 304 is irradiated at frequency "$f_1$" to excite the ball-like objects and an echo 306 is measured with a read-out magnetic field gradient 305 in the y-direction. At that time, substances of resonance frequency "$f_1$" in the subject are also excited; however, because the quantity of the substances in the subject is very small, the echo 306 is not affected by the excitement of the substances. The echo 306 undergoes Fourier transformation and obtained thereby are the images of the ball-like objects A, B, and C projected on the y-axis, as shown in FIG. 6B. The intensity of their images is in proportion to the concentration of the $f_1$-resonance substance in them.

Next, an RF pulse 307 is irradiated at frequency "$f_1$" to excite the ball-like objects and an echo 309 is measured with a read-out magnetic field gradient 308 in the z-direction. At that time, substances of resonance frequency "$f_1$" in the subject are also excited; however, because the quantity of the substances in the subject is very small, the echo 309 is not affected by the excitement of the substances. The echo 309 undergoes Fourier transformation and obtained thereby are the images of the ball-like objects A, B, and C projected on the z-axis, as shown in FIG. 6C. The intensity of their images is in proportion to the concentration of the $f_1$-resonance substance in them.

Because the concentration of the $f_1$-resonance substance in the objects A, B, and C differs from object to object, the intensity of images of FIG. 6 tells which image belongs to which object, and the coordinates of each object can be found directly from FIGS. 6A, 6B, and 6C. For example, the x-coordinates of objects A, B, and C are found to be $x_a$, $x_b$, and $x_c$. Because the sum of concentration values of any two objects is not equal to the concentration value of the other object, each object can be identified even if two of the three projected images overlap each other. For example, in FIG. 6C, the degrees of intensity of the first and second images are 3 and 4, respectively, indicating that the images of objects A and B overlap each other to form the first image; i.e., $z_a$ is equal to $z_b$. Any coordinate system may be adopted. For example, x-, y-, and z-axes may be in the x-, y-, and z-directions shown in FIG. 3 and the origin may be set at the center of the bed 116.

Thus, the coordinates $P_A$ ($x_a$, $y_a$, $z_a$), $P_B$ ($x_b$, $y_b$, $z_b$), and $P_c$ ($x_c$, $y_c$, $z_c$) of the centers of objects A, B, and C are found. These three points define a plane ABC for imaging.

The computer 109 calculates the normal vector "n=(nx, ny, nz)" of the plane ABC and sends it to the sequencer 104. The normal vector "n" is a vector (yab×zac−zab×yac, zab×xac−xab×zac, xab×yac−yab×xac)=(nx, ny, nz) which is normal to the vector AB (xb−xa, yb−ya, zb−za)=(xab, yab, zab) and the vector AC (xc−xa, yc−ya, zc−za)=(xac, yac, zac). When the RF pulses 301, 304, and 307 are applied to the region of the subject 103 to be examined, the sequencer 104 controls the power supply 105 so as to apply magnetic field gradients Gx, Gy, and Gz of the intensity ratio of "nx:ny:nz" to the subject to take an image of the designated section. Parameters for imaging such as imaging method, field of view [a prescribed part of the shadowed area shown in FIG. 4A], and slicing thickness are inputted beforehand in the computer 109 or the sequencer 104.

The field of view and spatial resolution influence the precision in identifying the section to be imaged. For example, to secure a practical level of precision, the field of view of 50 cm and the sampling number of 512 in measuring each echo will do. In this case, the spatial resolution is about 1 mm (50 cm/512) and the positions of objects A, B, and C are determined with the precision of about 1 mm.

Figure 7A:
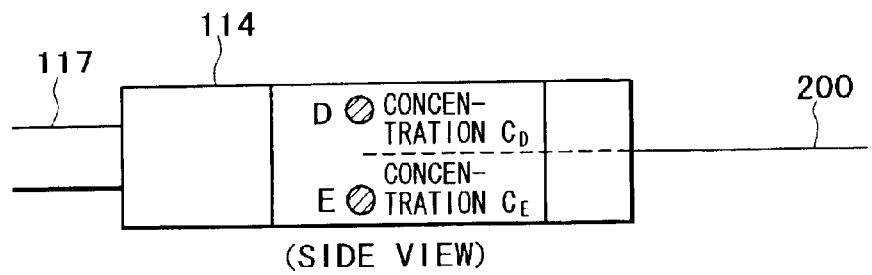
FIGS. 7A and 7B are a side view and a plane view, respectively, of a second preferred example of the section-designating unit for the first preferred embodiment of an NMR inspection apparatus of the present invention.
Figure 7B:
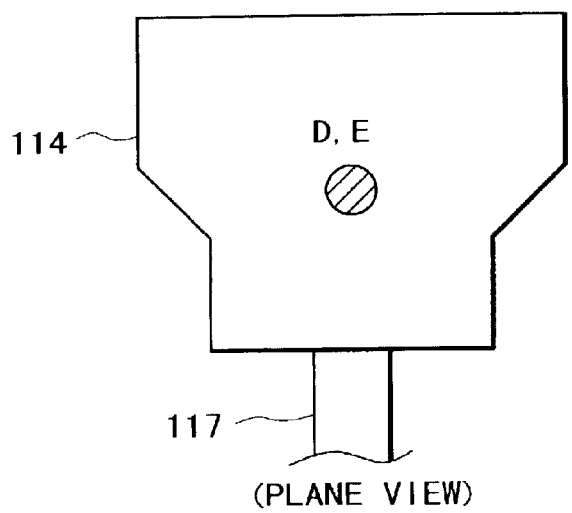
Figure 7C:
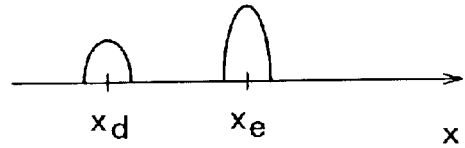
FIGS. 7C, 7D, and 7E illustrate the projected images of ball-like objects obtained by applying the pulse sequences of FIG. 5 to the objects.
Figure 7D:
Figure 7E:
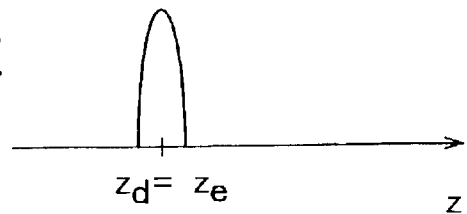

FIGS. 7A and 7B are a side view and a plane view, respectively, of a second preferred example of the section-designating unit 114 for the first preferred embodiment of an NMR inspection apparatus of the present invention. FIGS. 7C, 7D, and 7E illustrate the projected images of ball-like objects D and E obtained by applying the pulse sequences of FIG. 5 to the objects. As shown in FIGS. 7A and 7B, two ball-like objects D and E are arranged in a direction normal to a section 200 to be imaged and the section 200 can be identified with the two objects D and E. The objects D and E are filled with a substance (for example, any one of creatine, choline, or the primary standard substance of tetramethylsilane) of a resonance frequency "$f_1$" different from those of water and fat. The concentration values $c_D$ and $c_E$ of the $f_1$-resonance substance in the objects D and E are different from each other (for example, $c_D$:$c_E$=1:2).

In this case too, the section to be imaged is identified by taking the images of ball-like objects D and E projected on x-, y-, and z-axes with the pulse sequences of FIG. 5 and finding the coordinates of centers of objects D and E. In either of FIGS. 7C and 7D, there are two projected images, their intensity telling which image belongs to which object. In FIG. 7E, there is only one projected image, its intensity indicating that the two objects D and E overlap each other on the z-axis.

Thus, the coordinates $P_D$ ($x_d$, $y_d$, $z_d$) and $P_E$ ($x_e$, $y_e$, $z_e$) of the centers of objects D and E are found. Then, determined is a plane DE which includes the point of [(xd−xe)/2, (yd−ye)/2, (zd−ze)/2] and whose normal vector is (xd−xe, yd−ye, zd−ze). Imaging takes place in the plane DE.

Because the normal vector "(nx, ny, nz)" is found to be (xd−xe, yd−ye, zd−ze)", the computer 109 sends the normal vector as it is to the sequencer 104. When RF pulses 301, 304, and 307 are applied to the region of the subject 103 to be examined, the sequencer 104 controls the power supply 105 so as to apply magnetic field gradients Gx, Gy, and Gz of the intensity ratio of "nx:ny:nz" to the subject to take an image of the designated section. Parameters for imaging such as imaging method, field of view [a prescribed part of the shadowed area of FIG. 4A], and slicing thickness are inputted beforehand in the computer 109 or the sequencer 104.

In either case of the first and second preferred examples of the section-designating unit 114, no images are taken unless the imaging switch 115 is pushed. The section-designating unit 114 may be configured so that an image of a moving section will be displayed continuously without pushing the imaging switch 115, which helps the examiner to find out a desired section of the subject. In this case, the image of a moving section has to be displayed quickly on the display 110 so that the section designated by the section-designating unit 114 will check exactly with the section displayed on the display 110. If the GE method is used, the TR and the number of pixels may be set at 2 ms and 64×64, respectively. In this case, the imaging time is 128 ms and the frame rate is about 8 frames/sec. Because the pixel number of 64×64 is not enough for close examination, the section-designating unit 114 is configured so that the image of about 256×256 can be taken when the imaging switch 115 is pushed. These parameters are inputted beforehand in the computer 109 or the sequencer 104.

The section-designating unit 114 may be provided with a selector switches 115' to choose appropriate ones among various parameter values stored in the computer 109 or the sequencer 104. In this case, the computer 109 or the sequencer 104 controls pulse sequences with the chosen parameter values to take an image of the designated section.

FIG. 8 illustrates an example 405 of the section-designating unit for the first preferred embodiment of an NMR inspection apparatus of the present invention. A section designated by the section-designating unit 405 is identified by CCD cameras. Three CCD cameras 401, 402, and 403 are supported by a support 404 to be disposed in the neighborhood of the subject 103 on the bed 116. Three light-emitting diodes A (406), B (407), and C (408) are arranged in the section-designating unit 405, and the CCD cameras 401, 402, and 403 are posed to catch the light from the LEDs A (406), B (407), and C (408). Although a section to be imaged is identified by using NMR signals in either case of the first and second preferred examples of the section-designating unit 114, the same is identified by using the LEDs and the CCD cameras in the case of the section-designating unit 405.

Figure 9A:
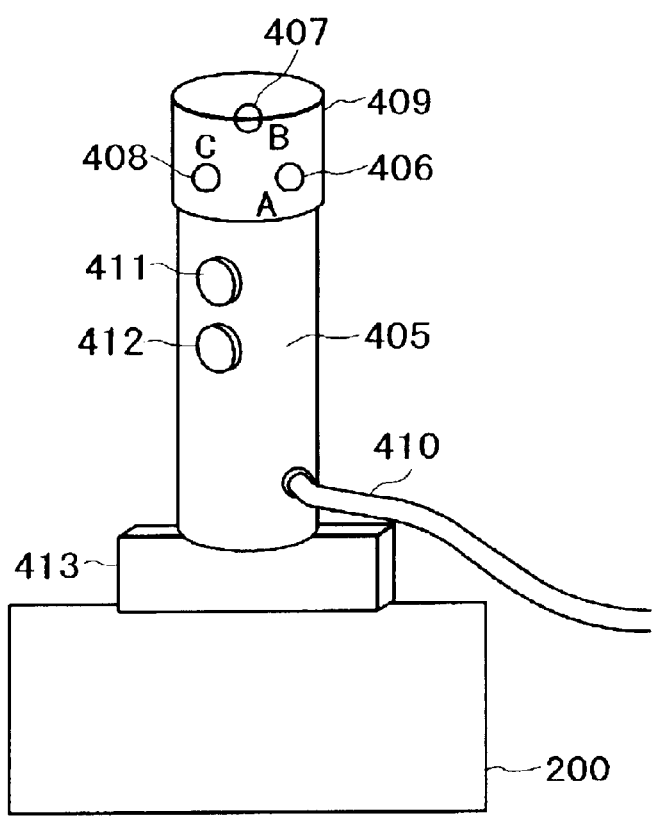
FIGS. 9A and 9B are perspective views of the section-designating unit of FIG. 8.
Figure 9B:
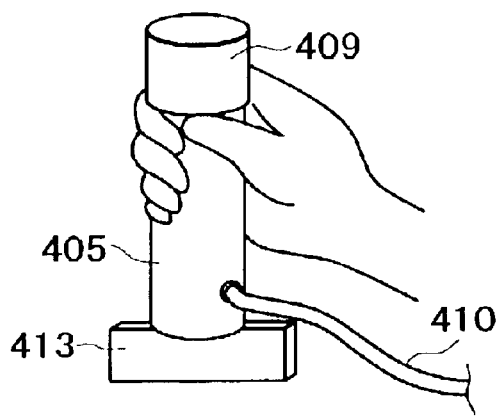

FIGS. 9A and 9B are perspective views of the section-designating unit 405. As shown in FIG. 9A, the LEDs A (406), B (407), and C (408) are arranged on a plane within a transparent case 409. The LEDs are flashing on and off in different cycles. The section-designating unit 405 has two imaging switches 411 and 412. When the imaging switch 411 is pushed, an instruction for a proton-density image is sent through a cable 410 to the computer 109. When the imaging switch 412 is pushed, an instruction for a T2-enhanced image is sent through the cable 410 to the computer 109. Parameters for taking proton-density images and T2-enhanced images are inputted beforehand in the sequencer 104. Besides, the section-designating unit 405 is provided with an auxiliary plate 413, which is aligned with the plane on which the LEDs are arranged, so as to help the examiner to grasp intuitively the position of a section being designated. As shown in FIG. 9B, the examiner holds the section-designating unit 405 in his hand and designates a section of the subject to be imaged.

When the imaging switch 411 or 412 is pushed, the images of the LEDs taken by the three CCD cameras are sent to the computer 109. The computer 109 distinguishes each LED from the others from their respective flashing cycles and calculates the coordinates of centers of LEDs in each image, from which the three-dimensional coordinates of centers of LEDs are calculated by the maximum likelihood method. The three-dimensional coordinates of the three center points of LEDs define a plane ABC for imaging.

Figure 10:
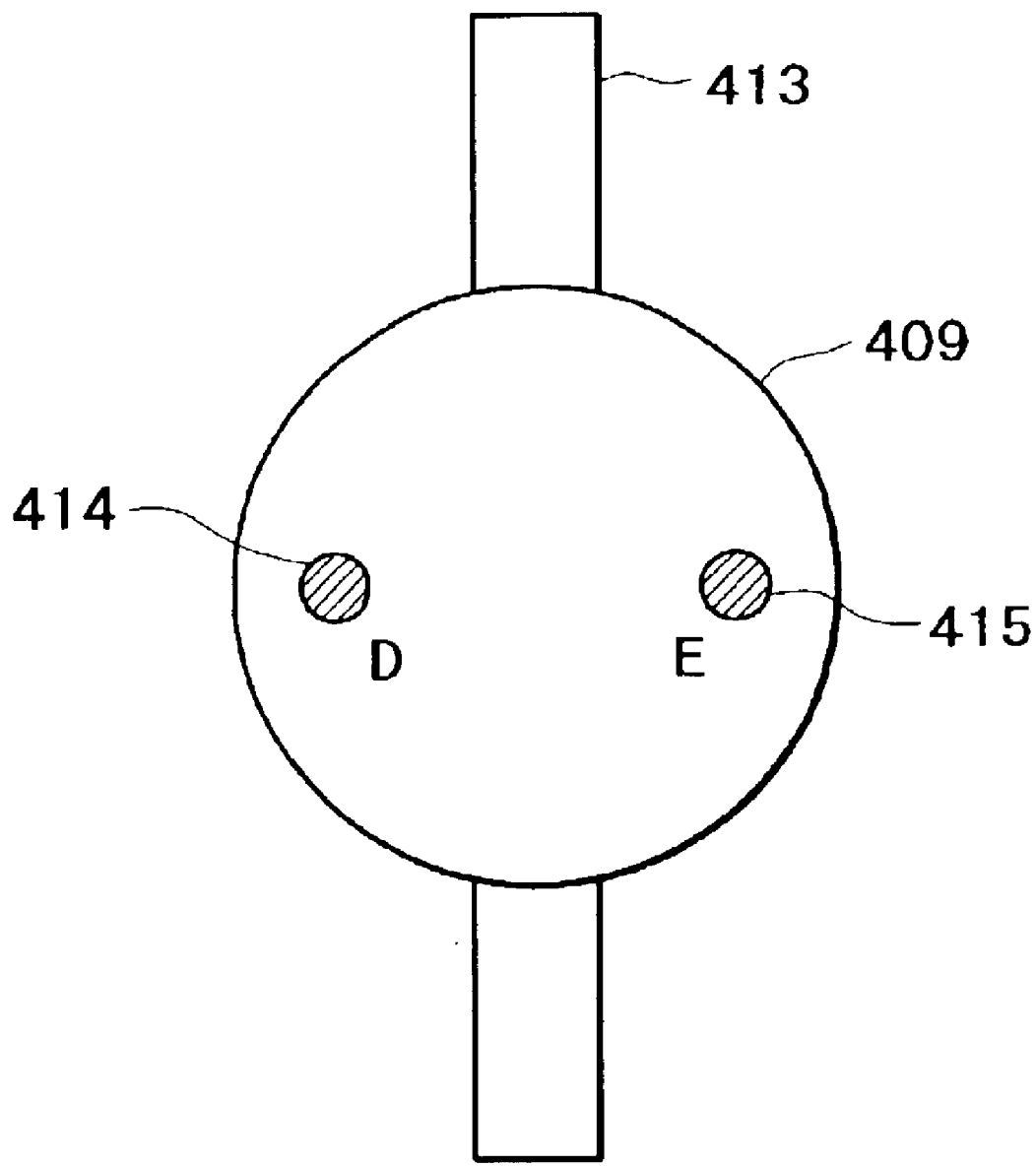
FIG. 10 is a plane view of a fourth preferred example of the section-designating unit for the first preferred embodiment of an NMR inspection apparatus of the present invention.

FIG. 10 is a plane view of a fourth preferred example of the section-designating unit for the first preferred embodiment of an NMR inspection apparatus of the present invention. Unlike the third preferred example 405 with three LEDs, this section-designating unit 405 has two LEDs D (414) and E (415) to identify a plane. As shown in FIG. 10, the two LEDs D and E are arranged in a direction normal to the auxiliary plate 413. As in the case of the third example 405 with three LEDs, the three-dimensional coordinates D(xd, yd, zd) and E(xe, ye, ze) of centers of LEDs D and E are calculated and a plane, which includes a point [(xd−xe)/2, (yd−ye)/2, (zd−ze)/2] and whose normal vector is (xd−xe, yd−ye, zd−ze), is found for imaging.

The first, second, third, and fourth preferred examples of the section-designating unit are used in the neighborhood of the subject, namely, in the static magnetic field generated by the magnets 101; therefore, their materials have to be non-magnetic. Because pictures on the CRT are warped in a magnetic field, the display 110 is preferably an LCD, which is almost free from the effects of magnetic fields.

Figure 11:
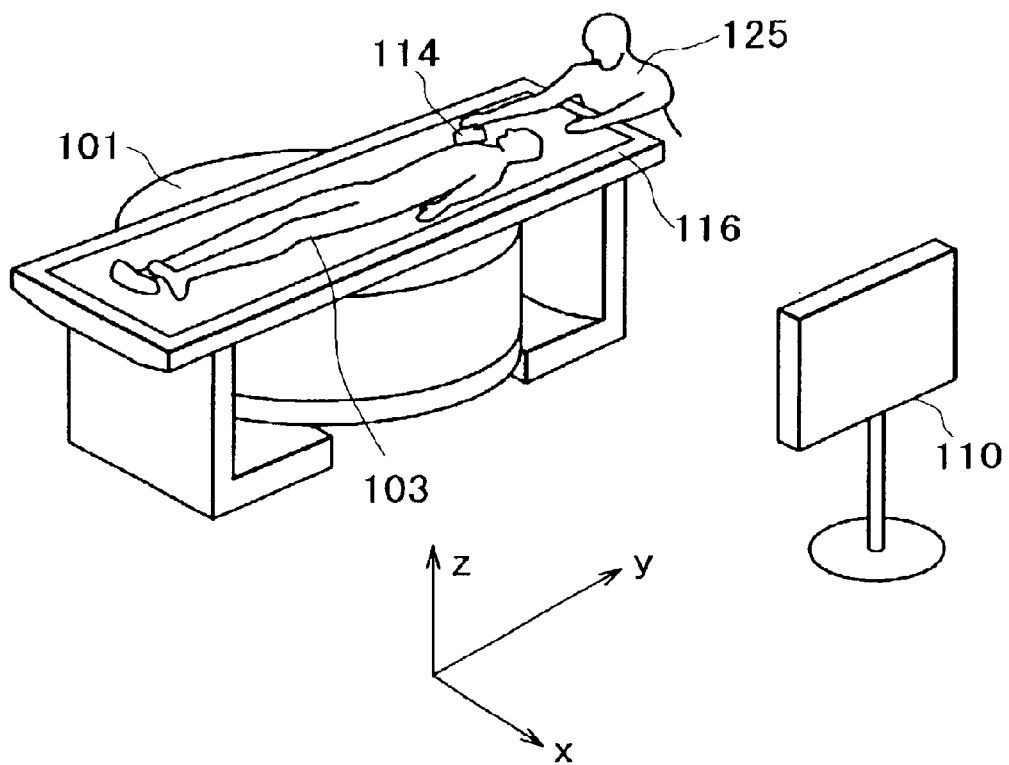
FIG. 11 is a perspective view of a second preferred embodiment of an NMR inspection apparatus of the present invention and a subject under examination.

FIG. 11 is a perspective view of a second preferred embodiment of an NMR inspection apparatus of the present invention and a subject under examination. Any of the first, second, third, and fourth preferred examples of the section-designating unit can be used in combination with this NMR inspection apparatus. Unlike the NMR inspection apparatus of FIG. 3, this NMR inspection apparatus has no upper magnet which would hang over the subject. Thus, this NMR inspection apparatus gives a feeling of openness to the subject 103. The subject 103 lies on a bed 116 in the static magnetic field generated by a lower magnet 101. An examiner 125 holds a section-designating unit 114 in his hand and designates directly a region of the subject to be examined.

An image taken is displayed on a display 110 in the neighborhood of the bed 116 so that the examiner can observe the image. Because the NMR inspection apparatus has no upper magnet 101, there is no obstacle above the subject; therefore, the examiner can operate the section-designating unit 114 easily and freely.

Preferred methods of the present invention for indicating the position of a section to be imaged on the surface of the subject are described below. Used in a first preferred method is one of the first, second, third, and fourth preferred examples of the section-designating unit which is further provided with a light source to irradiate a planar laser beam to the subject, as described below.

FIG. 12 is a perspective view of a fifth preferred example of the section-designating unit for the first and second preferred embodiments of an NMR inspection apparatus of the present invention. As shown in FIG. 12, this section-designating unit 114 has, in its front end, a light source to irradiate a sectorial laser beam 210. The plane 200 being designated and identified for imaging coincides with the plane of the sectorial laser beam 210. The section-designating unit 114 has a switch 118 to turn on and off the laser beam. When the switch 118 is turned on, the line of intersection 216 between the designated plane 200 and the periphery of the subject 103 (schematically shown as a column) appears so that the examiner can see the position of the section being designated.

In a second preferred method of indicating the position of a section to be imaged on the surface of the subject, one of the first, second, third, and fourth preferred examples of the section-designating unit is used and a light source set on a guide rail installed along one side of the bed 116 irradiates a planar laser beam to the subject, as described below.

FIG. 13 illustrates the second preferred embodiment of an NMR inspection apparatus of the present invention wherein the position of a section to be imaged is indicated on the surface of the subject. FIG. 14 is a perspective view of a mechanism to change the direction of laser-beam radiation. As shown in FIG. 13, a light source 211 for radiating a sectorial laser beam 210 to indicate the position of a section to be imaged is set on a guide rail 212 installed along one side of the bed 116. As shown in FIG. 14, the position of a joint 213 on the guide rail 212 and the angles of a joint 214, an arm 215, and the light source 211 can be changed freely by a small driving apparatus (not shown). The small driving apparatus is controlled by the computer 109 or the sequencer 104 so that the plane being designated and identified for imaging will coincide with the plane of the sectorial laser beam 210. The light source 211 set on the guide rail 212 is capable of radiating a sectorial laser beam to a wider area than the light source built in the front end of the section-designating unit 114; therefore, the examiner 125 can easily see the position of a section being designated.

A probe can be built in any one of the first, second, third, fourth, and fifth examples of the section-designating unit.

FIG. 15 is a plane view and a front view of a sixth preferred example of the section-designating unit for the first and second embodiments of an NMR inspection apparatus of the present invention. This section-designating unit 114 is the section-designating unit 114 of FIG. 14 which is further provided with a loop-type probe 231. The probe 231 is built in the section-designating unit 114 and connected through a cable 232 to a receiver 108 (not shown).

As in the case of the first preferred example of the section-designating unit, the pulse sequences of FIG. 5 are used and NMR signals from the ball-like objects A, B, and C of the section-designating unit 114 are measured to identify the section to be imaged. An RF pulse 301 is irradiated at frequency "$f_1$" to excite the objects A, B, and C and an echo 303 is measured with a read-out magnetic field gradient 302 in the x-direction. The RF pulse 301 is irradiated from the probe 107 outside the section-designating unit 114, whereas the echo 303 is measured by the probe 231 in the section-designating unit 114. As described earlier, when RF pulses 301, 304, and 307 are applied to the region of the subject 103 to be examined, the sequencer 104 controls the power supply 105 so as to apply magnetic field gradients Gx, Gy, and Gz of the intensity ratio of "nx:ny:nz" to the subject to take an image of the designated section.

As described above, the probe 107 outside the section-designating unit 114 irradiates RF pulses, whereas the probe 231 in the section-designating unit 114 measures echoes; therefore, the probe 231 is always positioned close to the region being examined. In general, the shorter the distance between a probe and a section to be imaged is, the higher the probing sensitivity is. Thus, the probe 231 is capable of acquiring signals of a high SN ratio.

The handling of any one of the first to sixth section-designating units can be made easier by using infrared signals.

Figure 16:
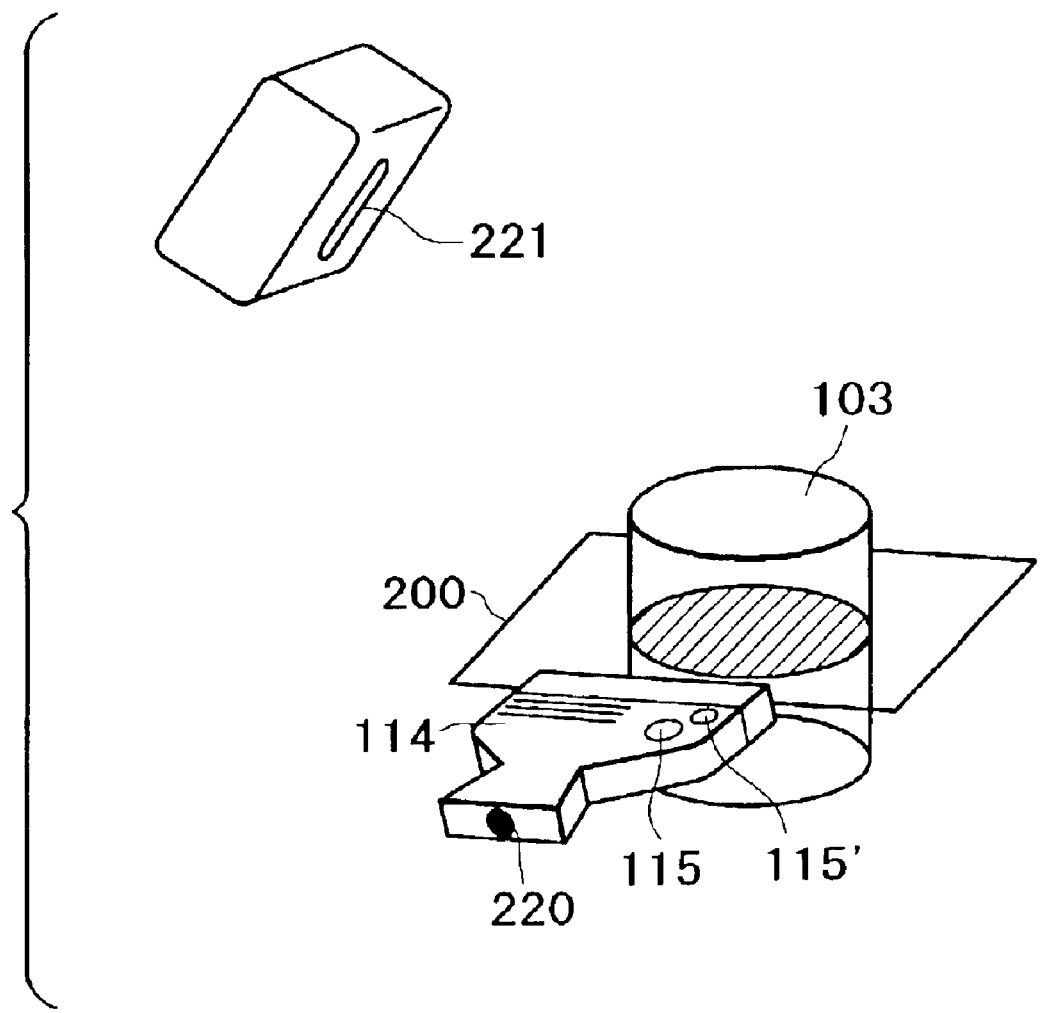
FIG. 16 is a perspective view illustrating a preferred section-designating unit, which uses infrared signals, for the first and second preferred embodiments of an NMR inspection apparatus of the present invention.

FIG. 16 is a perspective view of a preferred section-designating unit, which uses infrared, for the first and second preferred embodiments of an NMR inspection apparatus of the present invention. This section-designating unit 114 is any one of the first, second, fifth, and sixth preferred examples of the section-designating unit which is provided with an infrared emitter 220 instead of the cable 117. In the case of the third and fourth examples, the section-designating unit 405 may be provided with an infrared emitter instead of the cable 410 to transmit the signals of the imaging switches 411 and 412. In any case, a light-receiving unit 221 is installed on the ceiling or a wall of the examination room and connected to the computer 109. The signals of imaging switches 115, 411, and 412 and parameter selector switches 115' are transmitted from the infrared emitter 220 to the light-receiving unit 221 and further sent to the computer 109. An instruction for imaging in accordance with those signals is sent from the computer 109 to the sequencer 104 and then the section to be imaged is identified and imaged. Thus, the examiner is released from the inconvenience of handling the cable of the section-designating unit.

As described above in detail, according to the present invention, while watching the subject, the examiner can directly designate a section to be imaged as if he were handling the probe of ultrasound diagnosis equipment. Thus, diagnoses can be made easily and quickly.

The foregoing invention has been described in terms of preferred embodiments. However, those skilled in the art will recognize that many variations of such embodiments exist. Such variations are intended to be within the scope of the present invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A nuclear-magnetic-resonance (NMR) inspection apparatus comprising:
   means for generating a static magnetic field;
   means for generating magnetic field gradients in first, second, and third directions normal to one another;
   means for generating a high-frequency magnetic field;
   means for detecting NMR signals derived from a subject;
   means for processing detected NMR signals;
   a section-designating unit for designating a plane including a section of the subject to be imaged; and
   a control unit for controlling the means for generating magnetic field gradients, the means for generating a high-frequency magnetic field, the means for detecting NMR signals, the means for processing detected NMR signals, and pulse sequences for taking an image of the section of the subject to be imaged,
   wherein the section-designating unit has reference objects that can be set at up to three reference points; the section-designating unit can be moved and operated in proximity to the subject disposed in said static magnetic field and said magnetic field gradients generated by the means for generating a static magnetic field and the means for generating magnetic field gradients, respectively; the means for processing detected NMR signals identifies a first plane including the middle point between two of said reference objects and whose normal vector is a vector connecting those two reference objects or a second plane including three of said reference objects in terms of reference spatial coordinates; and the control unit controls the means for generating magnetic field gradients so that a prescribed part of said first plane or said second plane is the section of the subject to be imaged.

2. An NMR inspection apparatus according to claim 1, wherein:
   the two or three reference objects are in the shape of a ball and contain a substance other than water and fat;
   the control unit performs control so as to apply a magnetic field gradient in the first direction to the subject after the application of a first high-frequency magnetic field to the subject, apply a magnetic field gradient in the second direction to the subject after the application of a second high-frequency magnetic field to the subject, and apply a magnetic field gradient in the third direction to the subject after the application of a third high-frequency magnetic field to the subject so that images of the reference objects projected in the first, second, and third directions are obtained; and
   the means for processing detected NMR signals locates the centers of at least two of the reference objects by using the projected images.

3. An NMR inspection apparatus according to claim 2, wherein the concentration values of the substance of the two or three reference objects are different from each other or one another.

4. An NMR inspection apparatus according to claim 2, wherein the sum of the concentration values of the substance of any two of the three reference objects is different from the concentration value of the other reference object.

5. An NMR inspection apparatus according to claim 1, wherein the section-designating unit has an imaging switch.

6. An NMR inspection apparatus according to claim 5 further comprising:
   means for receiving infrared rays connected to the means for processing detected NMR signals, wherein the section-designating unit has a means for emitting infrared rays and signals of the imaging switch are transmitted by the means for emitting infrared rays and the means for receiving infrared rays to the means for processing detected NMR signals.

7. An NMR inspection apparatus according to claim 1, wherein:
   the section-designating unit has an imaging switch for starting to image the section of the subject to be imaged and selector switches to choose parameter values stored in the control unit; and
   the control unit controls the pulse sequences for imaging in accordance with the parameter values chosen by the selector switches to take an image of the section of the subject to be imaged.

8. An NMR inspection apparatus according to claim 7 further comprising:
   means for receiving infrared rays connected to the means for processing detected NMR signals;
   the section-designating unit has means for emitting infrared rays; and
   signals of the imaging switch and the selector switches are transmitted by the means for emitting infrared rays and the means for receiving infrared rays to the means for processing detected NMR signals.

9. An NMR inspection apparatus according to claim 1, wherein:
   the two or three reference objects are light-emitting diodes (LEDs) flashing on and off in different cycles; and
   the means for processing detected NMR signals locates the centers of light-emitting faces of the LEDs by using the images of the LEDs taken by TV cameras.

10. An NMR inspection apparatus according to claim 1 further comprising:
    a first display means disposed in a room shielded from electromagnetic waves and a second display means disposed outside the room; and
    an image of the section of the subject to be imaged is displayed simultaneously on both the first and second display means.

11. An NMR inspection apparatus according to claim 1 wherein the section-designating unit is put into contact with the subject to designate the section of the subject to be imaged.

12. An NMR inspection apparatus according to claim 1 wherein the section-designating unit designates the section of the subject to be imaged without coming into contact with the subject.

13. An NMR inspection apparatus according to claim 1 further comprising:
    a display means;
    wherein the section-designating unit has an imaging switch and an image of the section of the subject to be imaged is displayed on the display means while the imaging switch is off and an image of a higher resolution is displayed on the display means when the imaging switch is turned on.

14. An NMR inspection apparatus according to claim 13 further comprising:
   means for receiving infrared rays connected to the means for processing detected NMR signals and means for emitting infrared rays in the section-designating unit;
   wherein signals of the imaging switch are transmitted by the means for emitting infrared rays and the means for receiving infrared rays to the means for processing detected NMR signals.

15. An NMR inspection apparatus according to claim 1, wherein:
   the section designating unit has a control switch for turning on and off sectorial light to the subject; and
   the sectorial light is radiated to indicate the position of the section of the subject to be imaged.

16. An NMR inspection apparatus according to claim 1 further comprising:
   a light source to radiate sectorial light to the subject and a controller for controlling the direction of radiation of sectorial light, wherein the control unit controls the controller so that the sectorial light is radiated to the position of the section of the subject to be imaged and thereby the position is indicated on the surface of the subject.

17. An NMR inspection apparatus according to claim 1 wherein the section-designating unit has a probe.

18. An NMR inspection apparatus comprising:
   means for generating a static magnetic field;
   means for generating magnetic field gradients in first, second, and third directions normal to one another;
   means for generating a high-frequency magnetic field;
   means for detecting NMR signals derived from a subject;
   means for processing detected NMR signals;
   a section-designating unit for designating a plane including a section of the subject to be imaged; and
   a control unit for controlling the means for generating magnetic field gradients, the means for generating a high-frequency magnetic field, the means for detecting NMR signals, the means for processing detected NMR signals, and pulse sequences for taking an image of the section of the subject to be imaged,
   wherein the section-designating unit has reference objects that can be set at up to three reference points, a probe and an imaging switch; the control unit controls the means for generating magnetic field gradients so that a prescribed part of (i) a first plane including the middle point between two of said reference objects and whose normal vector is a vector connecting those two reference objects or (ii) a second plane including the three reference objects, is the section of the subject to be imaged.

19. An NMR inspection apparatus comprising:
   means for generating a static magnetic field;
   means for generating magnetic field gradients in first, second, and third directions normal to one another;
   means for generating a high-frequency magnetic field;
   means for detecting NMR signals derived from a subject;
   means for processing detected NMR signals;
   a section-designating unit for designating a plane including a section of the subject to be imaged; and
   a control unit for controlling the means for generating magnetic field gradients, the means for generating a high-frequency magnetic field, the means for detecting NMR signals, the means for processing detected NMR signals, and pulse sequences for taking an image of the section of the subject to be imaged,
   wherein the section-designating unit has a probe and an imaging switch, and can be moved and operated in close proximity to the subject; and the means for generating magnetic field gradients is controlled so that a prescribed part of the plane designated by the section-designating unit is the section of the subject to be imaged.

20. An NMR inspection apparatus according to claim 19, wherein:
   the section-designating unit has reference objects that can be set at up to three reference points;
   the means for processing detected NMR signals identifies (i) a first plane including the middle point between two of said reference objects and whose normal vector is a vector connecting those two reference objects or (ii) a second plane including three of said reference objects in terms of reference spatial coordinates; and
   the control unit controls the means for generating magnetic field gradients so that a prescribed part of said first plane or said second plane is the section of subject to be imaged.

* * * * *